US010867795B2

(12) United States Patent
Fung et al.

(10) Patent No.: US 10,867,795 B2
(45) Date of Patent: Dec. 15, 2020

(54) METHOD OF ETCHING HARDMASKS CONTAINING HIGH HARDNESS MATERIALS

(71) Applicant: Applied Materials, Inc., Santa Clara, CA (US)

(72) Inventors: Nancy Fung, Livermore, CA (US); Gene Lee, San Jose, CA (US); Hailong Zhou, San Jose, CA (US); Zohreh Hesabi, San Jose, CA (US); Akhil Mehrotra, Sunnyvale, CA (US); Shan Jiang, San Jose, CA (US); Abhijit Patil, San Jose, CA (US); Chi-I Lang, Cupertino, CA (US); Larry Gao, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/984,285

(22) Filed: May 18, 2018

(65) Prior Publication Data

US 2018/0337047 A1 Nov. 22, 2018

Related U.S. Application Data

(60) Provisional application No. 62/508,228, filed on May 18, 2017.

(51) Int. Cl.
*H01L 21/033* (2006.01)
*H01L 21/311* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/31116* (2013.01)

(58) Field of Classification Search
CPC ............. H01L 21/0332; H01L 21/0335; H01L 21/0337; H01L 21/0338; H01L 21/31116
See application file for complete search history.

(56) References Cited

U.S. PATENT DOCUMENTS

| 8,603,921 | B2 * | 12/2013 | Shimizu | H01L 21/31116 |
| | | | | 257/E21.232 |
| 9,378,971 | B1 | 6/2016 | Briggs et al. | |
| 9,384,998 | B2 | 7/2016 | Hudson et al. | |
| 9,484,216 | B1 * | 11/2016 | Bauer | H01L 21/31122 |
| 9,543,158 | B2 * | 1/2017 | Hudson | H01J 37/32091 |
| 2016/0163557 | A1 | 6/2016 | Hudson et al. | |
| 2016/0163558 | A1 | 6/2016 | Hudson et al. | |
| 2016/0260617 | A1 | 9/2016 | Hudson et al. | |
| 2016/0260620 | A1 | 9/2016 | Briggs et al. | |
| 2016/0268141 | A1 | 9/2016 | Hudson | |
| 2016/0343580 | A1 | 11/2016 | Hudson | |

* cited by examiner

*Primary Examiner* — Andrew Q Tran
(74) *Attorney, Agent, or Firm* — Patterson + Sheridan, LLP

(57) ABSTRACT

A method of etching a hardmask layer formed on a substrate is provided. The method includes supplying an etching gas mixture to a processing region of a processing chamber. A device is disposed in the processing region when the etching gas mixture is supplied to the processing region. The device comprises a substrate and a hardmask layer formed over the substrate. The etching gas mixture comprises a fluorine-containing gas, a silicon-containing gas, and an oxygen-containing gas. The method further includes providing RF power to the etching gas mixture to form a plasma in the processing region. The plasma is configured to etch exposed portions of the hardmask layer.

5 Claims, 3 Drawing Sheets

METHOD OF ETCHING HARDMASKS CONTAINING HIGH HARDNESS MATERIALS

CROSS-REFERENCE TO RELATED APPLICATIONS

This application claims benefit of U.S. provisional patent application Ser. No. 62/508,228, filed May 18, 2017, which is hereby incorporated herein by reference.

BACKGROUND

Field

Embodiments of the present disclosure generally relate to methods for forming semiconductor device structures.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-22 nm scale, conventional hardmask materials, such as titanium nitride (TiN), have reached their useful limits due to their poor mechanical properties (e.g., mechanically weak, high compressive stress, etc.), large grain size, and undesirable etching properties, such as micro-loading.

The demands for greater integrated circuit densities also impose demands on the process sequences used in the manufacturing of integrated circuit components. As the physical dimensions of the structures used to form semiconductor devices are pushed against technology limits, the process of accurate pattern transfer for structures that have smaller critical dimensions and higher aspect ratios has become increasingly difficult. For example, a dry plasma etching process is typically performed to form an interconnect structure that includes features with small critical dimensions and high aspect ratios. However, current dry plasma etching processes are primarily performed by physical sputtering, which results in low selectivity between the underlying layer(s) (e.g., metal layer) and the hardmask layer used during the etching process. Typically, the hardmask layer is patterned to remove a portion of the hardmask layer to expose an underlying metal layer for etching to form the interconnect structure. Conventional processes for patterning the hardmask layer over a metal layer often have poor etching stop control and low selectivity, which can result in damaging the metal structure disposed under the hardmask layer. Additionally, as the hardmask layer may sometimes be fabricated from a metal-containing material, which may have similar material properties to the metal layer disposed underneath, accurate control of the etch stopping point and etch selectivity becomes increasingly more challenging. Additionally, selectivity to the patterning layer(s) used to etch into the hardmask is also becoming increasingly more challenging. Furthermore, traditional methods for etching a hardmask layer generally uses aggressive halogen chemistries or oxidizing chemistries, which contaminate the nearby metal layer and may lead to non-volatile by-product formation, adversely passivating the metal surface and making it difficult to pattern the metal layer in the subsequent processes.

Thus, there is a need for improved methods for patterning a hardmask layer, especially a hardmask layer disposed on a metal layer, for an interconnect structure with improved process control to form accurate and desirable interconnect structures for semiconductor devices.

SUMMARY

Embodiments of the present disclosure generally relate to methods for forming semiconductor device structures. The disclosed methods include processes for patterning a hardmask layer of a device (e.g., a semiconductor device) to form features in the hardmask layer as part of a process for manufacturing an interconnect structure of the device. In one embodiment, a method of etching a hardmask layer formed on a substrate is provided. The method includes supplying an etching gas mixture to a processing region of a processing chamber. A device is disposed in the processing region when the etching gas mixture is supplied to the processing region. The device comprises a substrate and a hardmask layer formed over the substrate. The etching gas mixture comprises a fluorine-containing gas, a silicon-containing gas, and an oxygen-containing gas. The method further includes providing RF power to the etching gas mixture to form a plasma in the processing region, wherein the plasma is configured to etch exposed portions of the hardmask layer.

In another embodiment, a method of etching a hardmask layer formed on a substrate is provided. The method includes supplying an etching gas mixture to a processing region of a processing chamber. A device is disposed in the processing region when the etching gas mixture is supplied to the processing region. The device comprises a substrate and a hardmask layer formed over the substrate. The hardmask layer comprises tungsten. The etching gas mixture comprises a fluorine-containing gas, a silicon-containing gas, and an oxygen-containing gas. The method further comprises providing RF power to the etching gas mixture to form a plasma in the processing region, wherein the plasma is configured to etch exposed portions of the hardmask layer.

In another embodiment, a method of etching a hardmask layer formed on a substrate is provided. The method includes supplying an etching gas mixture to a processing region of a processing chamber. A device is disposed in the processing region when the etching gas mixture is supplied to the processing region. The device comprises a substrate and a hardmask layer formed over the substrate. The hardmask layer comprises tungsten and carbon. The etching gas mixture comprises chlorine ($Cl_2$), nitrogen tri-fluoride ($NF_3$), and silicon tetrachloride ($SiCl_4$). The method further includes providing RF power to the etching gas mixture to form a plasma in the processing region, wherein the plasma is configured to etch exposed portions of the hardmask layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides methods for patterning a hardmask layer of a device (e.g., a semiconductor device) to form features in the hardmask layer as part of a process for manufacturing an interconnect structure of the device. The disclosed methods describe processes for etching hardmask layer(s) formed of high hardness materials, such a tungsten carbide (WC) and tungsten boron carbide (WBC), with improved selectivity. For example, the disclosure provides methods for etching high hardness materials with a selectivity when compared to etching silicon oxide at a ratio greater than about 20:1, such as greater than about 60:1. A more complete list of materials considered to be formed of high hardness materials is provided below.

Figure 1:
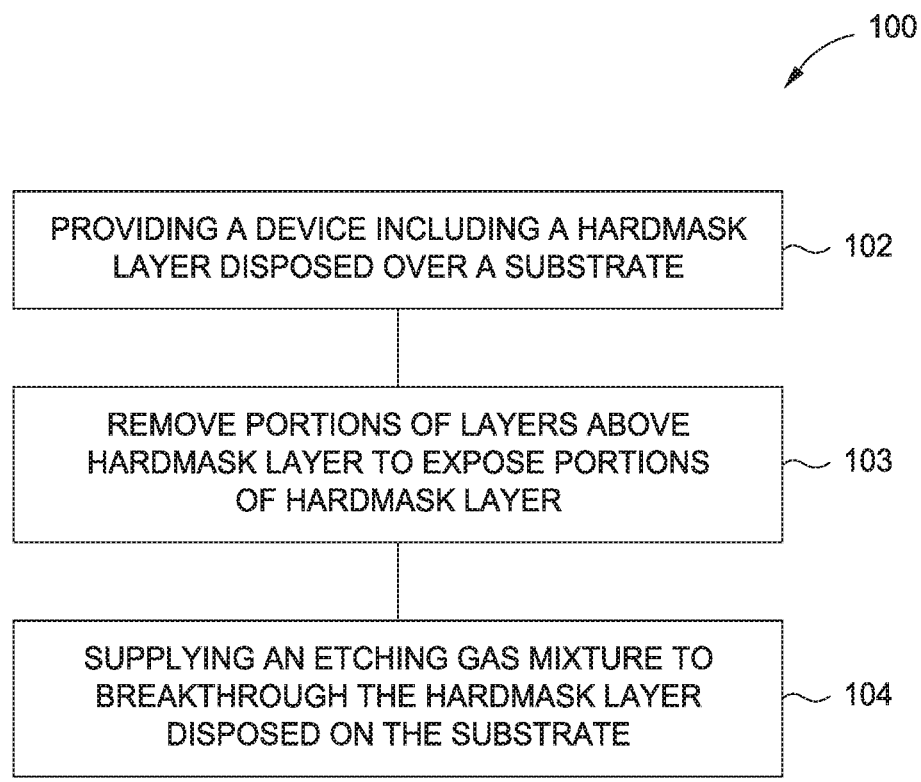
FIG. 1 is a flow diagram of a method for patterning a hardmask layer of a device, such as a semiconductor device, according to one embodiment.

FIG. 1 is a flow diagram of a method 100 for patterning a hardmask layer of a device, such as a semiconductor device, according to one embodiment. In some embodiments, the hardmask layer can be disposed on a metal layer, such as a copper layer. The patterning of the hardmask layer can be used for manufacturing an interconnect structure of the device. The patterning method 100 can be performed in a processing chamber, such as a plasma processing chamber. The following describes the method 100 of FIG. 1 in conjunction with views shown in FIGS. 2A-2C, which show the device that includes the hardmask layer at different stages of the method 100. Furthermore, although the method 100 is described below with reference to the device having the hardmask layer disposed on the metal layer utilized to form an interconnect structure, the method 100 can also be used to advantage in other semiconductor device manufacturing applications.

Figure 2A:
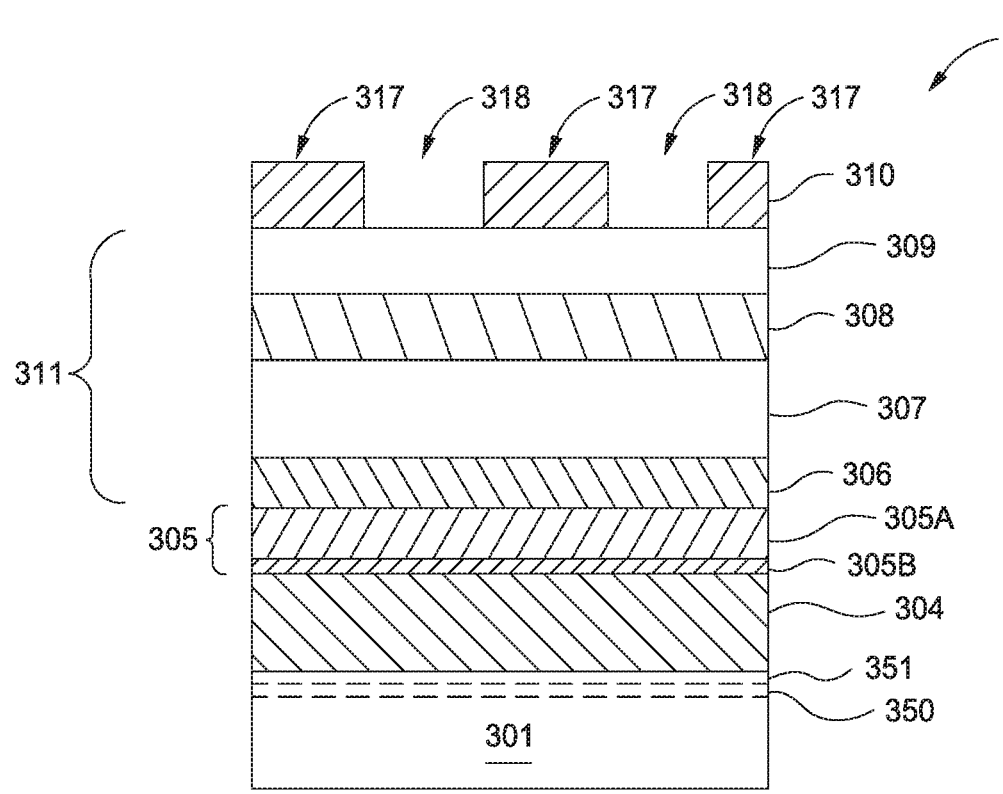
FIG. 2A is a schematic cross-sectional view of at least a portion of a device including a hardmask layer before portions of one or more layers above the hardmask layer are removed, according to one embodiment.

At block 102, a device 300 (see FIG. 2A) including a hardmask layer 305 (see FIG. 2A) is provided, for example to an etching process chamber (not shown). The device 300 can include one or more semiconductor devices that are in the process of being manufactured. FIG. 2A is a schematic cross-sectional view of a portion of the device 300 that includes the hardmask layer 305 before portions of one or more layers above the hardmask layer 305 are removed, according to one embodiment. The view in FIG. 2A shows the device 300 before an initial patterning process (e.g., an etching process) is performed to expose portions of the hardmask layer 305.

The device 300 includes a substrate 301, such as a silicon substrate. The hardmask layer 305 is disposed over the substrate 301. The hardmask layer 305 can be formed of a high hardness material, such a tungsten carbide (WC) and tungsten boron carbide (WBC), as well as other high hardness materials described below. The hardmask layer 305 can be used to stop an etching process (see e.g., description of block 103 below) performed on one or more layers disposed over the hardmask layer 305. The device 300 can further include a metallic layer 304 disposed between the substrate 301 and the hardmask layer 305. In some embodiments, the hardmask layer 305 is formed directly on the metallic layer 304. In other embodiments, the hardmask layer 305 can be formed directly on the substrate.

The substrate 301 can be a material, such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, or sapphire among other materials. The substrate 301 can be a 200 mm, 300 mm, 450 mm, or another diameter wafer. Furthermore, the substrate 301 can be a wafer, a rectangular substrate, or a square substrate. In an embodiment in which a SOI structure is used for the substrate 301, the substrate 301 can further include a buried dielectric layer disposed on a silicon crystalline substrate. In another embodiment, the substrate 301 can be a crystalline silicon substrate.

In some embodiments, the substrate 301 can be a thermally oxidized substrate. In some embodiments including a thermally oxidized substrate, the hardmask layer 305 can be formed directly on the substrate 301. The thermally oxidized substrate can include oxygen at the surface contacting the hardmask layer 305. When portions of the hardmask layer 305 are removed as described below to expose the thermally oxidized substrate, the oxygen from the thermally oxidized substrate can be used to form a passivation layer on exposed surfaces of the device 300 (e.g., the sidewalls of the dielectric layer 306 described below) to stop further etching when the etching process breaks through the hardmask layer 305. For example, in one embodiment, the oxygen from the thermally oxidized substrate can combine with a silicon-containing gas used to etch the hardmask layer 305 to form a passivation layer of silicon oxide on exposed portions of the device 300 to stop the etching process. Although the passivation layer is described here as being formed in part by oxygen from a thermally oxidized substrate, the oxygen can more generally come from a layer including oxygen that directly underlies the hardmask layer 305.

The device 300 can further include a barrier layer 351 and a low-k insulating dielectric layer 350. The low-k insulating dielectric layer 350 can be disposed over the substrate 301 between the metal layer 304 and the substrate 301. The barrier layer 351 can be disposed over the low-k insulating dielectric layer 350 between the metal layer 304 and the low-k insulating dielectric layer 350. The barrier layer 351 can be fabricated from TaN, TiN, AlN, TaSiN, TiSiN, SiN, SiON, SiC, SiNC, SiOC, or other suitable materials. Furthermore, the low-k insulating dielectric layer 350 can be formed from SiO containing materials, SiN containing materials, SiOC containing materials, SiC containing materials, carbon-based materials, or other suitable materials.

The metal layer 304 can be fabricated from tungsten (W), tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, and combinations thereof, among others. In the embodiment depicted in FIGS. 2A-2C, the metal layer 304 is a copper layer or a copper alloy layer having a thickness between about 200 Å and about 500 Å, such as about 350 Å. In some embodiments, the metal layer 304 can be disposed directly on the substrate 301.

The hardmask layer 305 can be formed of a high hardness material, such as tungsten carbide (WC), tungsten boron carbide (WBC), tungsten nitride (WN), silicon boride (SiB$_x$), boron carbide (BC), amorphous carbon, boron nitride (BN), boron carbon nitride (BCN), or another similar material. The hardmask materials described above can comprise compounds (e.g., a chemical compound of equal parts tungsten and carbon, a stoichiometric compound, etc.) or a doped material (e.g., a tungsten layer containing a small percentage of carbon). Furthermore, in some embodiments, the hardmask layer 305 can comprise a first metal-containing layer 305A that is disposed on a second metal-containing layer 305B. In some embodiments, the first metal-containing layer 305A can include a tungsten carbide (WC), a tungsten boron carbide (WBC), tungsten nitride (WN), silicon boride (SiB$_x$), boron carbide (BC), amorphous carbon, boron nitride (BN), boron carbon nitride (BCN) or other similar material. In some embodiments, the second metal-containing layer 305B can include a tungsten nitride (WN), boron carbide (BC), amorphous carbon ($\alpha$-C), a tungsten carbon nitride (WCN), or other similar material that can act as an improved interface between the underlying layer(s) (e.g., metal layer 304) and the first metal-containing layer 305A. Alternately, in some applications, a portion of the hardmask layer 305, such as either the first metal-containing layer 305A or the second metal-containing layer 305B, can include titanium nitride (TiN), titanium oxide (TiO) or titanium silicon nitride (TiSiN). In the embodiment depicted in FIGS. 2A-2B, the hardmask layer 305 has a thickness between about 100 Å and about 400 Å, such as 200 Å and about 300 Å.

The device 300 further includes a patterning structure 311 formed over the substrate 301. The patterning structure 311 includes the layers of the device 300, other than the hardmask layer 305, that are patterned (e.g., have portions removed, for example through etching) during execution of the method 100. The patterning structure 311 includes one or more additional layers formed over the hardmask layer 305. In some embodiments, these one or more additional layers can include a dielectric layer 306 (e.g., a 250 Å TEOS oxide layer), an advanced patterning film (APF) layer 307 (e.g., a 500 Å amorphous carbon layer), an ARC (anti-reflective coating) layer 308 (e.g., a 200 Å SiN layer), and a bottom anti-reflective coating layer (BARC) layer 309 (e.g., a 250 Å BARC layer).

The device 300 can further include a patterned mask layer 310 formed over the patterning structure 311. In one embodiment, the patterned mask layer 310 can include a resist layer (e.g., a photoresist layer) disposed on a dielectric film material. Suitable examples of the resist layer of the patterned mask layer 310 can include a positive tone photoresist, a negative tone photoresist, a UV lithography photoresist, an i-line photoresist, an e-beam resist (for example, a chemically amplified resist), or another suitable energy-sensitive resist material. The patterned mask layer 310 can be disposed over the patterning structure 311 to form a mask that includes masked regions 317 (i.e., regions including the material of the patterned masked layer 310) and unmasked regions 318 (i.e., portions of the mask that do not include the material of the patterned mask layer 310). The unmasked regions 318 can be used for selective removal of one or more layers in the patterning structure 311 as shown in the changes in the device 300 from FIGS. 2A to 2B.

Figure 2B:
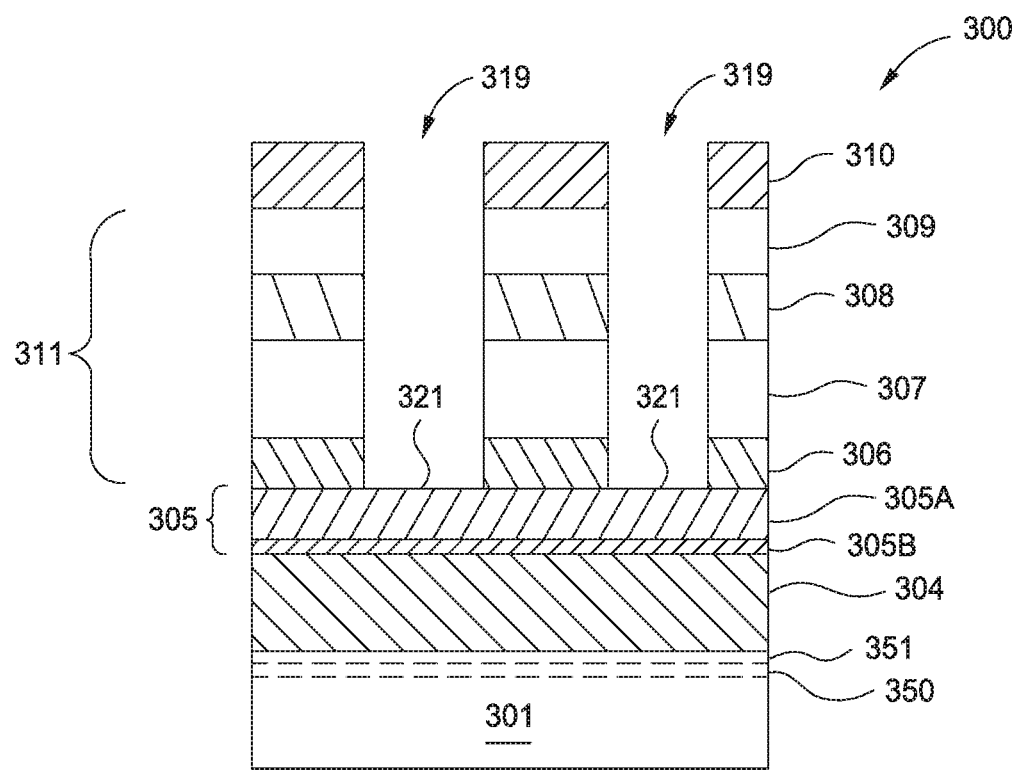
FIG. 2B is a schematic cross-sectional view of the portion of the device of FIG. 2A including the hardmask layer after portions of a patterning structure above the hardmask layer are removed, according to one embodiment.

At block 103, portions of the layers in the patterning structure 311 are removed to form exposed portions 321 of the hardmask layer 305 as shown in FIG. 2B. FIG. 2B is a schematic cross-sectional view of a portion of the device 300 including the hardmask layer 305 after portions of the patterning structure 311 above the hardmask layer 305 are removed, according to one embodiment. In one embodiment, the patterning structure 311 can be etched by one or more processes to form the exposed portions 321 of the hardmask layer 305. The portions of the patterning structure 311 removed correspond to the portions of the patterning structure 311 underlying the unmasked regions 318 shown in FIG. 2A. The removal of these portions of the patterning structure 311 underlying the unmasked regions 318 forms voids 319 in the patterning structure 311, shown in FIG. 2B as trenches with the bottom of the voids 319 formed by the exposed portions 321 of the hardmask layer 305.

Although the use of the materials described above for the hardmask layer 305 (i.e., the high hardness materials, such as WC) can improve the process of selectively etching features above the hardmask layer 305, eventually portions or all of the hardmask layers, such as hardmask layer 305, are removed to form features on the device, such as interconnect structures. Selective removal of these high hardness materials used as hardmasks has proved challenging, especially as critical dimensions of semiconductor devices continue to shrink. Block 104 describes methods for addressing these challenges.

Figure 2C:
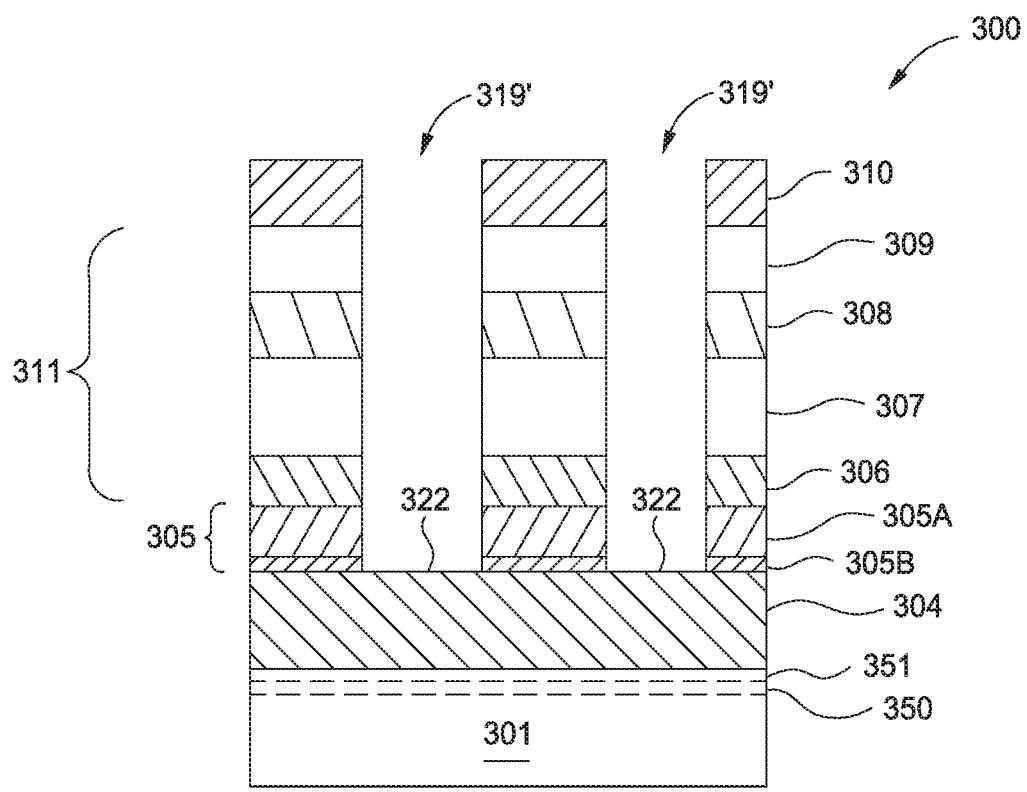
FIG. 2C is a schematic cross-sectional view of the portion of the device of FIGS. 2A and 2B after portions of the hardmask layer are removed, according to one embodiment.

At block 104, portions of the hardmask layer 305 are removed to form exposed portions 322 of the metal layer 304 as shown in FIG. 2C. FIG. 2C is a schematic cross-sectional view of a portion of the device 300 after portions of the hardmask layer 305 are removed, according to one embodiment. The portions of the hardmask layer 305 removed correspond to the portions of the hardmask layer 305 underlying the exposed portions 321 of the hardmask layer 305 shown in FIG. 2B. The removal of these portions of the hardmask layer 305 underlying the exposed portions 321 of the hardmask layer 305 forms voids 319' in the patterning structure 311 and hardmask layer 305, shown in FIG. 2C as trenches with the bottom of the voids 319' formed by the exposed portions 322 of the metal layer 304. In some embodiments, the voids 319' shown in FIG. 2C can essentially be deeper versions of the voids 319 shown in FIG. 2B. As described above, in some embodiments, the hardmask layer 305 may be formed directly on a layer including oxygen, such as a thermally oxidized substrate. In such embodiments, performing block 104 results in forming exposed portions of the oxygen-containing layer (e.g., the thermally oxidized substrate).

At block 104, an etching gas mixture is supplied into the processing region of a processing chamber (not shown) to perform an etching breakthrough process. The etching breakthrough process etches portions of the hardmask layer 305 underlying the exposed portions 321 (see FIG. 2B) of the hardmask layer 305 to form exposed portions 322 (see FIG. 2C) of the underlying metal layer 304. The patterned mask layer 310 and portions of the patterning structure 311 underlying the patterned mask layer 310 can serve as an etching mask during the etching process of the hardmask layer 305. During block 104, the etching gas mixture can be continuously supplied to the processing region of the process chamber including the device 300 to etch the hardmask layer 305 until a targeted amount of the hardmask layer 305 is removed, such as the complete thickness of the hardmask layer 305. Suitable processing chambers that may be adapted for use with the teachings disclosed herein include, for example, a Sym3™, ENABLER® or C3® processing chamber available from Applied Materials, Inc. of Santa Clara, Calif.

When the etching gas mixture is supplied to the processing chamber during block 104, an RF source power can be energized to form a plasma from the etching gas mixture therein. The RF source power can be supplied with power between about 50 Watts and about 2000 Watts (e.g., 500 Watts) at a frequency between about 400 kHz and about 13.56 MHz. A RF bias power can also be supplied as needed to a substrate support inside the process chamber on which the device 300 is supported during block 104. This RF bias power applied to the substrate support can be supplied at less than 200 Watts, for example between about 30 Watts and about 160 Watts, such as 90 Watts, to reduce bias bombardment impact on the device 300 during processing at block 104. In one embodiment, the RF bias source power can be pulsed with a duty cycle between about 10 to about 95 percent at a RF frequency between about 500 Hz and about 10 kHz. In another embodiment, the RF frequency of the bias source power can be provided at a frequency between about 1 MHz and about 20 MHz, such as 2 MHz or 13.56 MHz.

In one embodiment, the etching gas mixture supplied to etch the hardmask layer 305 can include at least a fluorine-containing gas, an oxygen-containing gas (e.g., $O_2$), and a silicon-containing gas (e.g., silicon tetrachloride ($SiCl_4$)). In some embodiments, the etching gas mixture can additionally include a chlorine-containing gas ($Cl_2$), a nitrogen-containing gas ($N_2$), and a carrier gas (e.g., helium (He), neon (Ne), argon (Ar), etc.). The fluorine-containing gas can include a gas such as nitrogen tri-fluoride ($NF_3$), sulfur hexafluoride ($SF_6$), or other useful fluorine-containing gases. In some embodiments, the silicon-containing gas can include silicon tetrachloride ($SiCl_4$), silicon tetrafluoride ($SiF_4$), silane ($SiH_4$), disilane ($Si_2H_6$), or another silicon-containing gas.

While not wanting to be bound by theory, it is believed that the use of the silicon-containing gas in combination with the oxygen-containing gas and the fluorine-containing gas (e.g., $NF_3$) can form a passivation layer (e.g., a passivation layer of silicon oxide) on the surface and side walls of the pattern mask layer 310 and exposed portions of the patterning structure 311 layers (e.g., the dielectric layer 306) within the voids 319' during block 104. In embodiments in which the layer directly underlying the hardmask layer 305 includes oxygen (e.g., a thermally oxidized substrate), the oxygen-containing gas can be omitted. In these embodiments, the oxygen from the layer underlying the hardmask layer 305 can be used to provide the oxygen that forms the passivation layer. In other embodiments, oxygen used to passivate the surfaces and side walls of the pattern mask layer 310 is provided from an oxygen-containing gas and/or from oxygen provided from a thermally oxidized substrate.

It is further believed that the formation of the passivation layer (not shown) provides for an enhanced etch selectivity during the etching process of the hardmask layer 305 at block 104. For example, a passivation layer of silicon oxide formed on the surface of the dielectric layer 306 (e.g., a layer formed of TEOS) can make the etching process more selective since fluorine-containing gases can etch the exposed portions of the dielectric layers, such as TEOS, faster than the formed silicon oxide containing passivating layer. Thus, the formation of the passivation layer makes the etching gas mixture more selective towards etching the hardmask layer 305 relative to the other layers, such as the dielectric layer 306, which can be formed of TEOS. Thus, formation of the passivation layer can result in high hardness materials, such as WC and WBC, being etched using the etching gas mixtures described herein with a selectivity when compared to etching silicon oxide at ratios greater than about 20:1, such as ratios greater than about 60:1. This improved selectivity enables the formation of features on semiconductor devices (e.g., interconnect structures) having smaller critical dimensions and higher aspect ratios, which allows faster circuitry and greater circuit density to be achieved. Furthermore, use of the high hardness materials described herein (e.g., WC and WBC) offer improved etch-stopping control when compared to conventional hardmasks, such as hardmasks lacking high hardness materials, such as a hardmask formed only of TiN. Thus, the use of hardmasks comprising high hardness materials (e.g., WC and WBC) coupled with the improved selectivity of the methods described herein for etching the hardmasks comprising the high hardness materials (e.g., WC and WBC) allows for faster circuitry and greater circuit density to be achieved.

It is also believed that the use of the processes described herein can prevent line bending, line wiggle and line collapse for BEOL processes by reducing the occurrence of induced mechanical stresses. The reduced occurrences of induced mechanical stresses is attributed to the formation of the passivation layer, which is created by the addition of silicon-containing gas and oxygen-containing gas that tends to release previously formed stresses. In some embodiments in which a gas mixture including a fluorine-containing gas and a chlorine-containing gas are used to remove the hardmask layer, the fluorine-containing gas and the chlorine-containing gas can form an aggressive etching gas mixture to quickly remove the exposed hardmask layer 305. In such embodiments, the metal elements (e.g., W) from the hardmask layer 305 can react with the aggressive etchants (i.e., the fluorine-containing gas and the chlorine-containing gas) from the plasma to form volatile etching by-products, which are readily pumped out of the processing chamber. For example, for a hardmask layer 305 including tungsten, the tungsten can react with fluorine to form volatile compounds that can be pumped out of the processing chamber. Furthermore, for a hardmask layer 305 including titanium, the titanium can react with chlorine to form volatile compounds that can be pumped out of the processing chamber.

In embodiments that include a hardmask layer 305 that comprises a first metal-containing layer 305A comprising tungsten and a second metal-containing layer 305B comprising titanium, chlorine can be added to the etching gas mixture to etch the second metal-containing layer comprising titanium, so that the volatile byproduct(s) including titanium and chlorine are generated during the etching of the second metal-containing layer 305B. As an alternative, in such embodiments, the ratio of chlorine to fluorine in the etching gas mixture can be increased during the etching of the second metal-containing layer 305B comprising titanium relative to during the etching of the first metal-containing layer 305A comprising tungsten.

In one embodiment of etching a tungsten carbide hardmask layer 305, the etching gas mixture at block 104 can be maintained at a processing flow rate that is achieved by providing $NF_3$ at a flow rate of between about 1 sccm and about 100 sccm, such as about 28 sccm, chlorine gas ($Cl_2$) at a flow rate of between about 1 sccm and about 100 sccm, such as about 14 sccm, nitrogen ($N_2$) at a flow rate of between about 1 sccm and about 100 sccm, such as about 60 sccm, oxygen ($O_2$) at a flow rate of between about 0.1 sccm and about 25 sccm, such as about 5 sccm, silicon tetrachloride ($SiCl_4$) at a flow rate of between about 0.1 sccm and about 25 sccm, such as about 5 sccm, and helium (He) at a flow rate of between about 1 sccm and about 1000 sccm, such as about 300 sccm. In another embodiment, a ratio of a flowrate (e.g., a flowrate measured in sccm) of the oxygen-containing gas (e.g., $O_2$) to a flowrate of the silicon-containing gas (e.g., $SiCl_4$) is maintained in the etching gas mixture during processing at block 104. In one particular embodiment, the flowrate ratio of silicon tetrachloride ($SiCl_4$) to oxygen ($O_2$) is maintained between about 2:1 and 1:100, such as between about 1:1 and 1:5.

Several process parameters can also be controlled while supplying the etching gas mixture to perform the etching process. For example, a pressure in the processing region of the processing chamber can be controlled at a pressure between about 0.5 milliTorr and about 500 milliTorr, such as a pressure between about 2 milliTorr and about 15 milliTorr, such as about 5 milliTorr. Furthermore, a temperature of the device 300 can be maintained between about 5 degrees Celsius to about 300 degrees Celsius, such as between about 15 degrees Celsius and about 100 degrees Celsius, for example, between about 20-40 degrees Celsius. The gas mixture for performing the etching process can be supplied to the processing region of the process chamber for periods of time between about 10 seconds and about 60 seconds, such as between about 10 seconds and 25 seconds to etch the hardmask layer 305.

In one particular embodiment of etching a tungsten carbide hardmask layer 305, the etching gas mixture at block 104 can include the following mixture of gases: 28 parts $NF_3$; 14 parts $Cl_2$; 60 parts $N_2$; 5 parts $SiCl_4$; 5 parts $O_2$; and 300 parts He. In one example, this etching gas mixture is provided to the surface of the substrate that is maintained at a temperature of between about 20 and about 40 degrees Celsius and while the chamber pressure is maintained at a pressure of between about 2 milliTorr and about 15 milliTorr, such as about 5 milliTorr. In some embodiments, the etching gas mixture at block 104 can include a gas mixture having a ratio between a first composition of 28 parts $NF_3$; 14 parts $Cl_2$; 60 parts $N_2$; 10 parts $SiCl_4$; 5 parts $O_2$; and 300 parts He and a second composition of 28 parts $NF_3$; 14 parts $Cl_2$; 60 parts $N_2$; 5 parts $SiCl_4$; 25 parts $O_2$; and 300 parts He. In other embodiments, the etching gas mixture at block 104 can include a gas mixture having a ratio between a first composition of 28 parts $NF_3$; 14 parts $Cl_2$; 60 parts $N_2$; 5 parts $SiCl_4$; 5 parts $O_2$; and 300 parts He and a second composition of 28 parts $NF_3$; 14 parts $Cl_2$; 60 parts $N_2$; 5 parts $SiCl_4$; 25 parts $O_2$; and 300 parts He.

While the foregoing is directed to embodiments of the present disclosure, other and further embodiments of the disclosure may be devised without departing from the basic scope thereof, and the scope thereof is determined by the claims that follow.

What is claimed is:

1. A method of etching, comprising:
supplying an etching gas mixture to a processing region of a processing chamber, wherein
a device is disposed in the processing region when the etching gas mixture is supplied to the processing region,
the device comprises a substrate, a hardmask layer formed over the substrate and a dielectric layer formed over the hardmask layer, and
the hardmask layer comprises tungsten and carbon, and
the etching gas mixture comprises chlorine ($Cl_2$), nitrogen tri-fluoride ($NF_3$), a silicon-containing gas and an oxygen-containing gas; and
providing RF power to the etching gas mixture to form a plasma in the processing region, wherein the plasma is configured to etch exposed portions of the hardmask layer through a void formed in the dielectric layer, wherein the silicon-containing gas comprises silicon tetrachloride ($SiCl_4$), silicon tetrafluoride ($SiF_4$), silane ($SiH_4$), or disilane ($Si_2H_6$).

2. The method of claim 1, wherein the hardmask layer comprises tungsten carbide (WC) or tungsten boron carbide (WBC).

3. The method of claim 1, wherein the plasma is configured to etch exposed portions of the hardmask layer to form exposed portions of a metal layer disposed between the hardmask layer and the substrate.

4. The method of claim 1, wherein the oxygen-containing gas comprises oxygen ($O_2$).

5. The method of claim 1, wherein a flowrate ratio of the silicon-containing gas to the oxygen-containing gas included in the etching gas mixture supplied to the processing region is between about 1:1 and about 1:5.

* * * * *